(12) United States Patent
Fukuda et al.

(10) Patent No.: US 6,872,986 B2
(45) Date of Patent: Mar. 29, 2005

(54) NITRIDE SEMICONDUCTOR DEVICE

(75) Inventors: Yoshikatsu Fukuda, Anan (JP); Akira Fujioka, Anan (JP)

(73) Assignee: Nichia Corporation, Tokushima (JP)

( * ) Notice: Subject to any disclaimer, the term of this patent is extended or adjusted under 35 U.S.C. 154(b) by 0 days.

(21) Appl. No.: 10/480,437

(22) PCT Filed: Jul. 3, 2002

(86) PCT No.: PCT/JP02/06706
§ 371 (c)(1),
(2), (4) Date: Dec. 12, 2003

(87) PCT Pub. No.: WO03/005459
PCT Pub. Date: Jan. 16, 2003

(65) Prior Publication Data
US 2004/0155248 A1 Aug. 12, 2004

(30) Foreign Application Priority Data
Jul. 4, 2001 (JP) .......................... 2001-203373

(51) Int. Cl.$^7$ .............................. H01L 33/00
(52) U.S. Cl. ................ 257/101; 257/102; 257/103; 257/745

(58) Field of Search .................. 257/101–103, 257/744, 745

(56) References Cited

U.S. PATENT DOCUMENTS

6,657,300 B2 * 12/2003 Goetz et al. ................ 257/745

FOREIGN PATENT DOCUMENTS

| EP | 1 063 711 | 12/2000 |
|----|-----------|---------|
| JP | 2000-101142 | 4/2000 |
| JP | 2000-232237 | 8/2000 |
| JP | 2001-148507 | 5/2001 |
| WO | WO 00/59046 | 3/2000 |

* cited by examiner

Primary Examiner—Mark V. Prenty
(74) Attorney, Agent, or Firm—Nixon & Vanderhye PC

(57) ABSTRACT

A nitride semiconductor element exhibiting low leakage current and high ESD tolerance includes an active layer of nitride semiconductor that is interposed between a p-sided layer and an n-sided layer, which respectively consist of a plurality of nitride semiconductor layers, the p-side layer including a p-type contact layer as a layer for forming p-ohmic electrodes, the p-type contact layer being formed by laminating p-type nitride semiconductor layers and n-type nitride semiconductor layers in an alternate manner.

17 Claims, 6 Drawing Sheets

NITRIDE SEMICONDUCTOR DEVICE

This application is the U.S. national phase of international application PCT/JP02/06706 filed 3 Jul. 2002 which designated the U.S., the entire content of which is incorporated herein by reference.

TECHNICAL FIELD

The present invention relates to a nitride semiconductor element employing a nitride semiconductor (for instance, $In_aAl_bGa_{1-a-b}N$, $0 \leq a$, $0 \leq b$, $a+b \leq 1$) that is used in light-emitting elements such as light-emitting diodes (LEDs), laser diodes (LDs), solar cells and optical sensors, photo acceptance elements or electronic devices such as transistors or power devices.

BACKGROUND ART

Nitride semiconductors are being paid attention to and are being actively studied and developed as semiconductor materials capable of comprising blue light-emitting elements (LEDs, LDs) or pure green light-emitting elements. While among elements employing such nitride semiconductors, blue LEDs or pure green LEDs of high luminance are being put to use as light sources such as full-colored LED displays, traffic lights or light sources in image scanners, it is expected that such LEDs are being employed for an even wider variety of uses in the future. Such LED elements are basically arranged in that there are sequentially laminated, on to a sapphire substrate, a buffer layer consisting of GaN, an n-sided contact layer consisting of Si-doped GaN, an active layer of InGaN of single-quantum-well structure (SQW) or of multi-quantum-well structure containing InGaN, a p-sided cladding layer consisting of Mg-doped AlGaN, and a p-sided contact layer consisting of Mg-doped GaN in this order, and the LED elements exhibit extremely superior characteristics in which a blue LED with an emission wavelength of 450 nm at 20 mA exhibits 5 mW and an external quantum efficiency of 9.1% while a green LED of 520 nm exhibits 3 mW and an external quantum efficiency of 6.3%.

However, accompanying the spread of use of such nitride semiconductors in the future, it is expected that demands for reductions of leakage currents and improvements in ESD (Electrostatic discharge) tolerance will increase in addition to emission intensities and luminous efficiencies.

DISCLOSURE OF INVENTION

It is an object of the present invention to provide a nitride semiconductor element exhibiting low leakage current and high ESD tolerance.

For achieving the above object, the nitride semiconductor element according to the present invention is a nitride semiconductor element including an active layer consisting of nitride semiconductor that is interposed between a p-sided layer and an n-sided layer, which respectively consist of a plurality of nitride semiconductor layers, wherein the p-sided layer includes a p-type contact layer as a layer for forming p-ohmic electrodes, and wherein the p-type contact layer is formed by laminating p-type nitride semiconductor layers and n-type nitride semiconductor layers in an alternate manner.

In the nitride semiconductor element according to the present invention of the above arrangement, since the p-type contact layer is formed by alternately laminating p-type nitride semiconductor layers and n-type nitride semiconductor layers, it is possible to increase the electrostatic breakdown voltage (ESD tolerance) and to reduce the leakage current when voltage is applied in a reverse direction wherein the p-side is negatively biased and the n-side is positively biased. This is considered to be mainly due to the fact that reverse bias voltage is applied to the pn junction within the p-type contact layer.

In the nitride semiconductor element according to the present invention, it is preferable that a film thickness ratio of the p-type nitride semiconductor layers with respect to the n-type nitride semiconductor layers (film thickness of p-type nitride semiconductor layers/n-type nitride semiconductor layers) is set to be not less than 1 and not more than 9.

In the nitride semiconductor element according to the present invention, it is preferable that a film thickness of the n-type nitride semiconductor layers is not more than 60 Å so as not to increase forward voltage.

In the nitride semiconductor element according to the present invention, it is preferable that the n-type nitride semiconductor layers are doped with Si for the purpose of obtaining favorable n-type conductivity while the p-type nitride semiconductor layers are doped with Mg for the purpose of obtaining favorable p-type conductivity.

In the nitride semiconductor element according to the present invention, it is preferable that the n-type nitride semiconductor layers consist of GaN doped with Si and that the p-type nitride semiconductor layers consist of GaN doped with Mg such that the resistivity of the p-type contact layer may be further reduced.

In the nitride semiconductor element according to the present invention, the n-type nitride semiconductor layers may be undoped layers while the p-type nitride semiconductor layers are doped with Mg. In this case, it is preferable that the n-type nitride semiconductor layers consist of undoped GaN and that the p-type nitride semiconductor layers consist of GaN doped with Mg.

BEST MODE FOR CARRYING OUT THE INVENTION

The nitride semiconductor element according to one embodiment of the present invention will now be explained with reference to the drawings.

Figure 1:
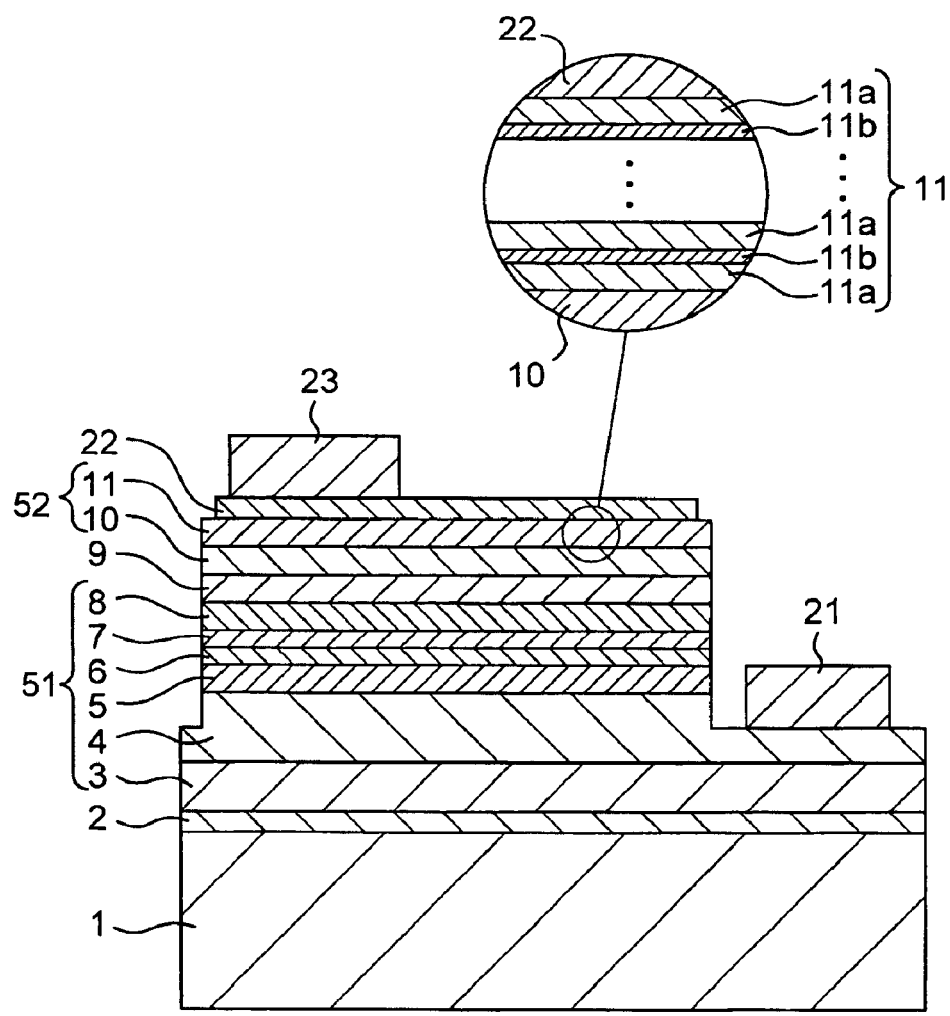
FIG. 1 is a schematic cross-sectional view of a nitride semiconductor element according to one embodiment of the present invention.

FIG. 1 is a schematic cross-sectional view illustrating a structure of a nitride semiconductor element (LED element) that represents one embodiment of the present invention, wherein the nitride semiconductor element of the present embodiment is arranged in that there are sequentially laminated, on to a sapphire substrate 1, (1) a buffer layer 2 consisting of AlGaN, (2) an undoped GaN layer 3, (3) an n-type contact layer 4 consisting of Si-doped GaN, (4) an undoped GaN layer 5, (5) a Si-doped GaN layer 6, (6) an undoped GaN layer 7, (7) a GaN/InGaN superlattice n-type layer 8, (8) an active layer 9 of multi-quantum-well structure with an InGaN layer comprising a well layer and a GaN layer comprising a barrier layer, (9) a p-AlGaN/p-InGaN superlattice p-type layer 10, and

(10) a Mg-doped GaN/Si-doped GaN modulated doped p-sided contact layer 11 in this order, and p-sided and n-sided electrodes are formed in the following manner.

N-ohmic electrodes 21 may be formed by eliminating all layers from the p-sided contact layer 11 up to the undoped GaN layer 5 at corner portions of the element through etching so as to expose a part of the n-type contact layer 4 whereupon the electrodes are formed on the exposed n-type contact layer 4.

As for the p-sided electrodes, p-ohmic electrodes 22 are formed on substantially the entire surface of the p-sided contact layer 11 whereupon p-pad electrodes 23 are formed on a part of the p-ohmic electrodes 22.

The nitride semiconductor element of the present embodiment is particularly characterized in that the p-sided contact layer 11 is comprised of a modulated doped layer in which Mg-doped GaN layers 11a and Si-doped GaN layers 11b are alternately laminated to thereby reduce the leakage current and to improve the ESD tolerance.

In the present embodiment, a preferable amount for Si-doping in the p-sided contact layer 11 (Si-doped GaN layers 11b) is adjusted to be within the range of $1 \times 10^{17}/cm^3$ to $1 \times 10^{21}/cm^3$ and more preferably of $1 \times 10^{18}/cm^3$ to $5 \times 10^{19}/cm^3$. By setting the amount to not less than $1 \times 10^{17}/cm^3$, effects of reducing leakage current become remarkable while when the amount exceeds $1 \times 10^{21}/cm^3$, the crystallinity will become worse so as to result in a tendency of degrading the luminous efficiency.

A preferable amount for Mg-doping in the p-sided contact layer 11 (Mg-doped GaN layers 11a) is defined to be $1 \times 10^{18}/cm^3$ to $1 \times 10^{21}/cm^3$ and more preferably of $1 \times 10^{19}/cm^3$ to $3 \times 10^{20}/cm^3$. More favorable ohmic contact with the p-ohmic electrodes may be achieved by setting the amount to be not less than $1 \times 10^{18}/cm^3$ while when it is set to exceed $1 \times 10^{21}/cm^3$, the crystallinity will become worse similar to a case when doping a large amount of Si.

In the present invention, the p-AlGaN/p-InGaN superlattice p-type layer 10 functions as a cladding layer, which is a layer for optical confinement and into which hole acceptors for the active layer are formed.

P-type impurities such as Mg are doped for making the p-AlGaN/p-InGaN superlattice p-type layer 10 be of p-type, wherein although the amount of Mg-doping for the p-AlGaN layer and the amount of Mg-doping for the p-InGaN layer may be either identical or different, it is preferable that both amounts are set to be smaller than the amount of Mg-doping for the Mg-doped GaN layers 11a of the p-sided contact layer whereby the Vf (forward voltage) may be further reduced.

The p-InGaN layer of the p-AlGaN/p-InGaN superlattice p-type layer 10 may be comprised of a Mg-doped GaN layer.

In the p-AlGaN/p-InGaN (p-GaN) superlattice p-type layer 10, the respective film thickness of the p-AlGaN layers and the p-InGaN (p-GaN) layers is set to be not more than 100 Å, and more preferably not more than 70 Å and even more preferably within the range of 10 to 40 Å. At this time, the film thickness of the p-AlGaN layers and the film thickness of the p-InGaN (p-GaN) layers may be either identical or different. While the superlattice p-type layer 10 is formed by alternately growing the p-AlGaN layers and the p-InGaN (p-GaN) layers, it is possible to start with a p-AlGaN layer and to finish with a p-AlGaN layer or alternatively, to start with a p-InGaN (p-GaN) layer and to finish with a p-InGaN (p-GaN) layer. However, it is preferable that the last layer is a p-AlGaN layer since InGaN layers are apt to thermal decomposition, and accordingly to prevent a case in which a surface of the InGaN layer is not exposed to a high temperature atmosphere for a long period of time.

It is further preferable to set the entire film thickness of the p-AlGaN/p-InGaN (p-GaN) superlattice p-type layer 10 to not more than 2,000 Å, preferably not more than 1,000 Å and more preferably not more than 500 Å for the purpose of increasing the luminous intensity while reducing the Vf.

It is preferable to set the respective film thickness of the p-AlGaN/p-InGaN (p-GaN) superlattice p-type layer 10 to be thinner than the respective film thickness of the p-type contact layer. More particularly, by comprising the layer that adjoins the p-type contact layer of multi-layered film structure as a superlattice layer in which the respective film thickness is set to be thinner than the respective film thickness of the n-type layers and p-type layers of the p-type contact layer, it is possible to comprise a nitride semiconductor element with even higher ESD tolerance.

While the present embodiment has been explained on the basis of an example in which the p-AlGaN/p-InGaN superlattice p-type layer 10 is used, the present invention is not limited to this arrangement as long as it contains at least AlGaN, and may thus be a single layer of AlGaN. By comprising a p-AlGaN/p-InGaN superlattice, the crystallinity tends to be more favorable than that of a AlGaN single layer so that the resistivity and thus the Vf are further reduced.

In the above descriptions of a preferred embodiment for reducing the Vf, the p-type contact layer has been comprised of n-type nitride semiconductor layers (Si-doped GaN layers) and p-type nitride semiconductor layers (Mg-doped GaN layers) both of which consist of GaN, but the present invention is not limited to this arrangement. It is possible to obtain substantially similar effects as those with GaN as long as InGaN containing therein a minute amount of In or AlGaN containing therein a minute amount of Al is employed. It is also possible to obtain substantially similar effects as those with GaN when other elements (elements other than In or Al) are contained in GaN by a small amount.

While Si-doped GaN layers have been employed as the n-type nitride semiconductor layers that comprise the p-type contact layer in the above embodiment, the present invention is not limited to such an arrangement, and it is possible to comprise the n-type nitride semiconductor layer of undoped n-type layers. More particularly, by utilizing the fact that an undoped nitride semiconductor layer exhibits conductivity of n-type, it is possible to employ undoped nitride semiconductor layers as the n-type nitride semiconductor layers. When employing undoped nitride semiconductor layers as the n-type nitride semiconductor layers, it is preferable to employ undoped GaN layers. More preferably, a p-type contact layer is comprised by combining undoped GaN layers and Mg-doped GaN layers.

EXAMPLES

The present invention will now be more concretely explained by the use of examples.

Example 1

In Example 1, three types of samples of different film thickness ratios between Mg-doped GaN layers 11a and Si-doped GaN layers 11b within the p-sided contact layer 11 were manufactured, and ESD tolerance properties in reverse directions were respectively evaluated.

In the present Example 1, the film thickness of the respective semiconductor layers were set as recited in Table 1, and the film thickness ratios between the Mg-doped GaN layers 11a and the Si-doped GaN layers 11b within the p-sided contact layer 11 were set as recited in Table 2.

TABLE 1

| Layer | Thickness (Å) and structure |
| --- | --- |
| Buffer layer 2 | 200 |
| Undoped GaN layer 3 | 15000 |
| N-type contact layer 4 | 21650 |
| Undoped GaN layer 5 | 3000 |
| Si-doped GaN layer 6 | 300 |
| Undoped GaN layer 7 | 50 |
| Superlattice n-type layer 8 | GaN (40)/InGaN(20) × 10 periods (last: GaN layer) |
| Active layer 9 of multi-quantum-well structure | GaN(250) + InGaN(28)/ GaN(15.6) × 5 periods |
| Superlattice p-type layer 10 | p-AlGaN(40)/p-InGaN(25) × 5 periods + p-AlGaN layer |
| p-sided contact layer 11 | 1200 |

TABLE 2

| Sample No. | Film thickness ratio | Mg: GaN layer 11a | Si: GaN layer 11b |
| --- | --- | --- | --- |
| Sample 1 | 9:1 | 108 Å | 12 Å |
| Sample 2 | 7:3 | 84 Å | 36 Å |
| Sample 3 | 5:5 | 60 Å | 60 Å |

It should be noted that in the above Example 1, the amount of Mg-doping of the GaN layers 11a was defined to be $1\times10^{20}\mathrm{cm}^{-3}$ and the amount of Si-doping of the GaN layers 11b was defined to be $5\times10^{18}\mathrm{cm}^{-3}$.

For the respective samples, the number of periods was 5 wherein a single GaN layer 11a and a single GaN layer 11b comprised one period.

Figure 2:
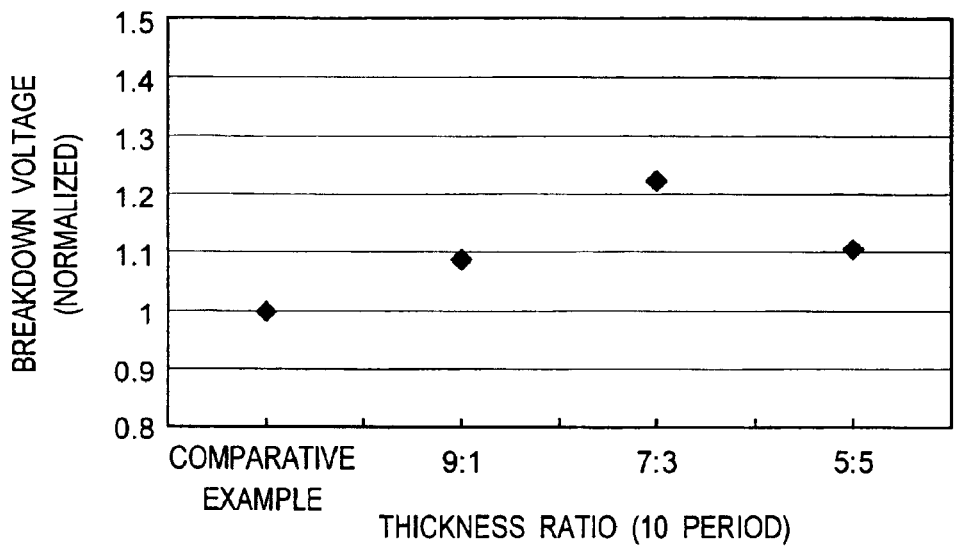
FIG. 2 is a graph illustrating electrostatic breakdown voltages of respective samples of Example 1 according to the present invention.

Results of respectively evaluating electrostatic breakdown voltages for the samples 1 to 3 manufactured in the above-described manner are illustrated in the graph of FIG. 2.

The longitudinal axis in the graph of FIG. 2 is illustrated to show values normalized through an electrostatic breakdown voltage of a reference sample (Comparative Example). Such a reference sample is arranged to be similar to Example 1 except for the point that the p-sided contact layer is comprised of a single layer consisting of GaN doped with Mg by $1\times10^{20}\mathrm{cm}^{-3}$.

As illustrated in the graph of FIG. 2, it was confirmed that the electrostatic breakdown voltages of all of the samples 1 to 3 of the present Example 1 were improved than that of the Comparative Example.

It was further confirmed that a highest electrostatic breakdown voltage could be achieved by accordingly setting the film thickness ratio to 7:3.

Modified Example of Example 1

In the Example 1, it is possible to form an AlGaN or GaN layer of low impurity density between the superlattice p-type layer and the p-type contact layer 11 to thereby further improve the ESD tolerance. Such an AlGaN or GaN layer of low density is formed to have a film thickness of not more than 0.5 μm, for instance, 0.2 μm. While this layer may be formed as an undoped layer or one doped with p-type impurities such as Mg, when this layer is formed while doping Mg, the density of Mg is defined to be lower than that of the layer adjoining thereto. In this manner, the ESD tolerance may be further improved when compared to the element of Example 1.

Example 2

In addition to the samples 1 to 3 of Example 1, a sample 4 with the film thickness of the Mg-doped GaN layers 11a being set to 36 Å and the film thickness of the Si-doped GaN layers 11b to 84 Å was prepared, and the amount of Si-doping for the Si-doped GaN layers 11b was varied in the range of 0 to $1.5\times10^{19}\mathrm{cm}^{-3}$ for the respective samples, and forward voltages and luminous intensity were respectively evaluated for the respective samples.

Figure 3:
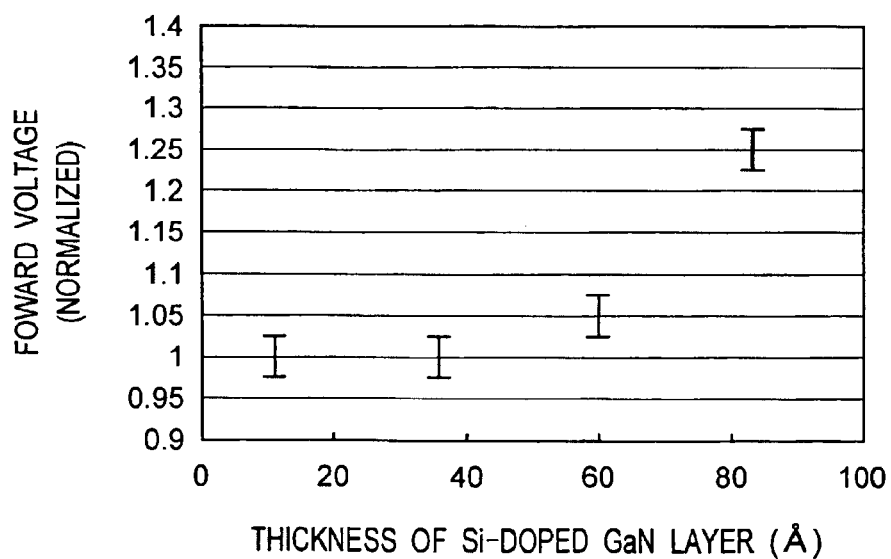
FIG. 3 is a graph illustrating forward voltages of respective samples of Example 2 according to the present invention.
Figure 4:
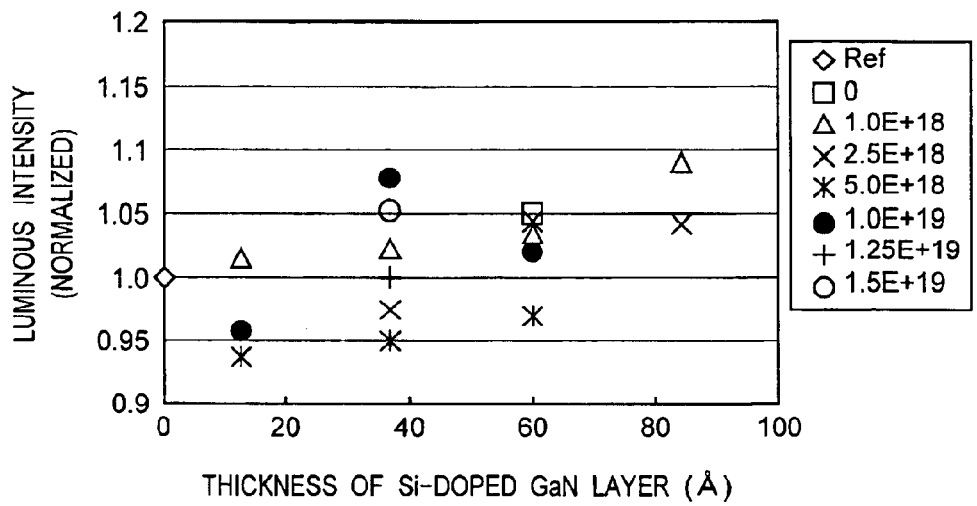
FIG. 4 is a graph for illustrating luminous intensity of the respective samples of Example 2.

The results are shown in FIGS. 3 and 4.

As illustrated in FIG. 3, it was confirmed for samples 1 to 3 that the forward voltages were not increased, and as illustrated in FIG. 4, that all of the luminous intensity of samples 1 to 4 were either equivalent or higher than that of the reference sample.

It should be noted that E+18 and E+19 in FIG. 4 respectively represent ($\times10^{18}$) and ($\times10^{19}$), the unit being $\mathrm{cm}^{-3}$.

Example 3

In the Example 3, three types of samples with the laminating period for the Mg-doped GaN layers 11a and the Si-doped GaN layers 11b being fixed to be 10 periods and the film thickness of the Mg-doped GaNs layer 11a being set to 84 Å and the film thickness of the Si-doped GaN layers 11b to 36 Å were manufactured with the amount of Si-doping of the Si-doped GaN layers 11b being set to be $1.0\times10^{18}/\mathrm{cm}^3$, $2.5\times10^{18}/\mathrm{cm}^3$, and $5\times10^{18}/\mathrm{cm}^3$, respectively, and electrostatic breakdown voltages thereof were measured.

Figure 5:
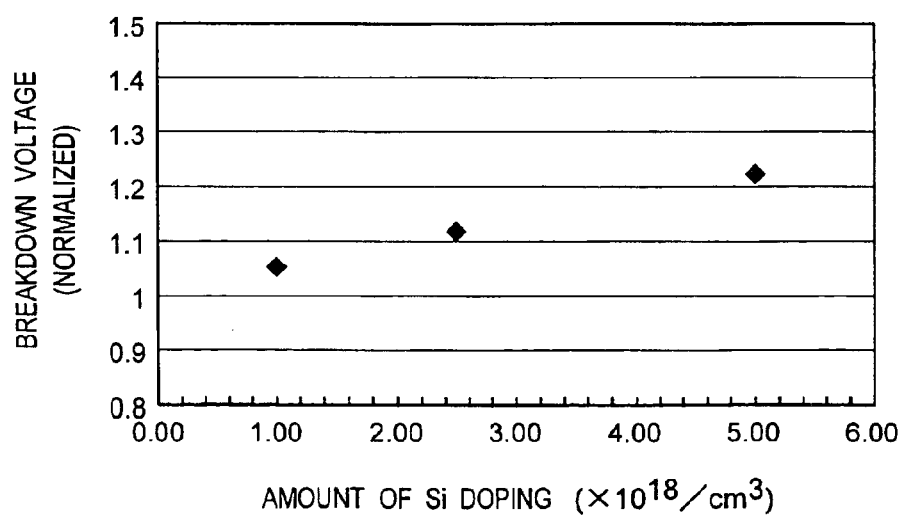
FIG. 5 is a graph illustrating electrostatic breakdown voltages of respective samples of Example 3 according to the present invention.

The results are illustrated in FIG. 5.

As illustrated in FIG. 5, it was confirmed that the more the amount of Si-doping was increased in the Si-doped GaN layers 11b, the more the electrostatic breakdown voltage would improve.

Example 4

In the Example 4, five types of samples with the film thickness ratio between the Mg-doped GaN layers 11a and the Si-doped GaN layers 11b being fixed to 7:3 and periods thereof being changed were manufactured as recited in Table 3 below, and forward voltages, luminous intensity and electrostatic breakdown voltages were respectively measured.

TABLE 3

| Sample No. | Period | Mg: GaN layers 11a | Si: GaN layers 11b |
|---|---|---|---|
| Sample 4-1 | 1 | 494 Å | 212 Å |
| Sample 4-2 | 5 | 147 Å | 63 Å |
| Sample 4-3 | 10 | 84 Å | 36 Å |
| Sample 4-4 | 15 | 56 Å | 24 Å |
| Sample 4-5 | 30 | 28 Å | 12 Å |

Here, the amount of Si-doping for the Si-doped GaN layers 11b was set to $5\times10^{18}/cm^3$.

Figure 6:
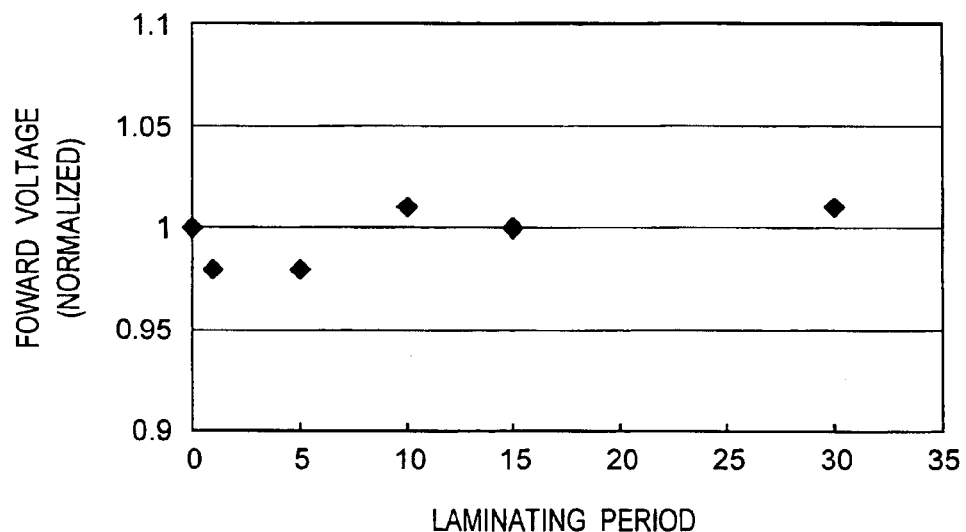
FIG. 6 is a graph illustrating forward voltages of respective samples of Example 4 according to the present invention.
Figure 7:
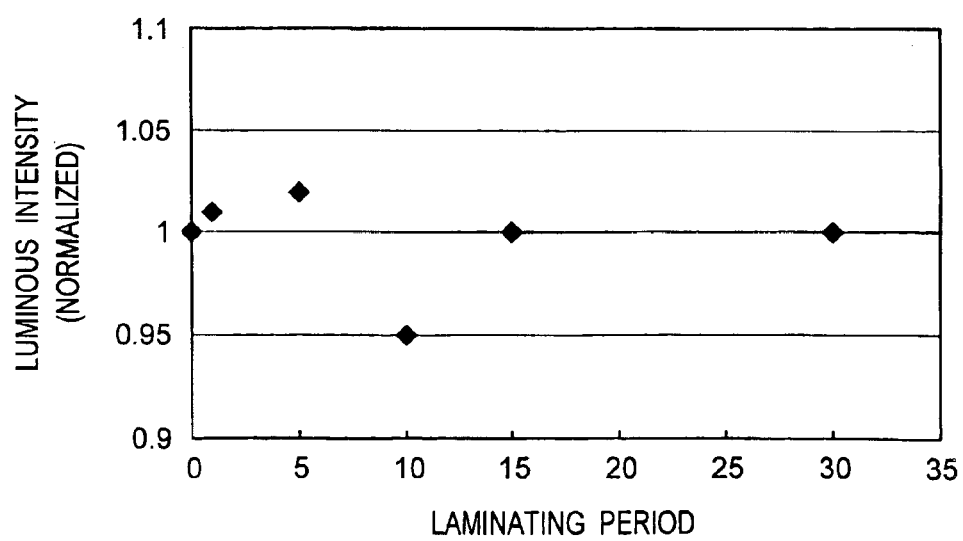
FIG. 7 is a graph for illustrating luminous intensity of the respective samples of Example 4.
Figure 8:
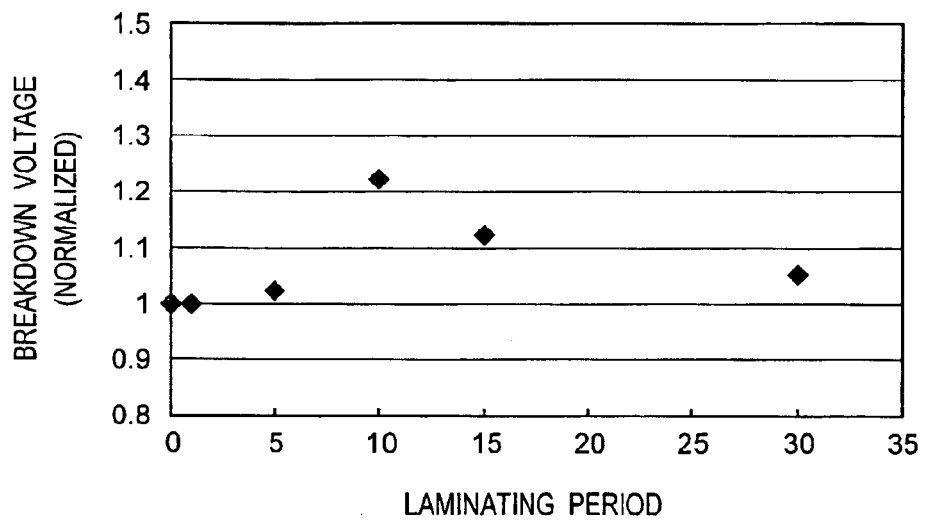
FIG. 8 is a graph illustrating electrostatic breakdown voltages of respective samples of Example 4 according to the present invention.

The results are shown in FIGS. 6, 7 and 8.

As illustrated in FIGS. 6 and 7, it was confirmed that the forward voltages and luminous intensity were substantially independent from the laminating periodicity.

Further, as illustrated in FIG. 8, the electrostatic breakdown voltage became highest with 10 periods, and second thereto, with 15 periods.

Example 5

In the Example 5, in a contact layer arranged in that the ratio between the film thickness of the Mg-doped GaN layers 11a (84 Å) and the Si-doped GaN layers 11b (36 Å) being fixed to 7:3, which also comprised one period, and in that 10 periods thereof were repeated, the amount of Si-doping for the Si-doped GaN layers 11b was respectively varied in the range of 0 to $1.5\times10^{19}/cm^3$, and the forward voltages and luminous intensity were respectively evaluated.

Figure 9:
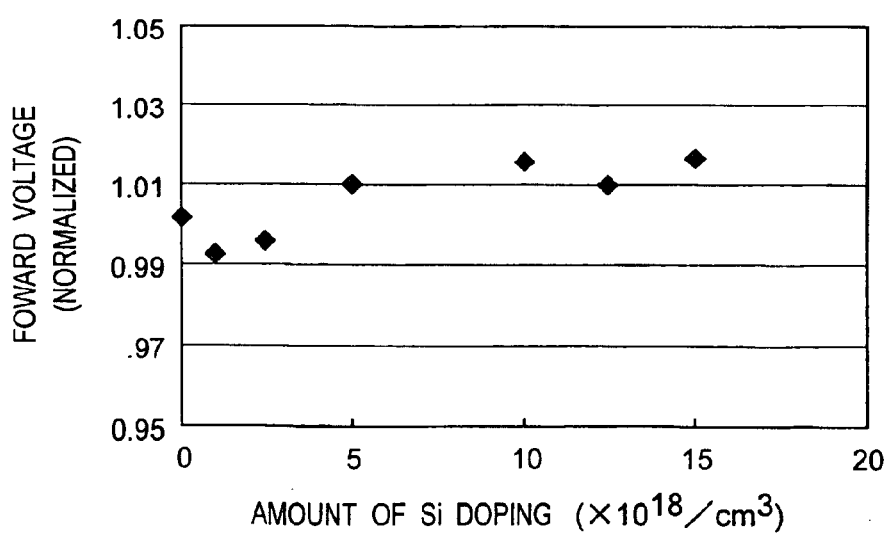
FIG. 9 is a graph illustrating forward voltages of respective samples of Example 5 according to the present invention.
Figure 10:
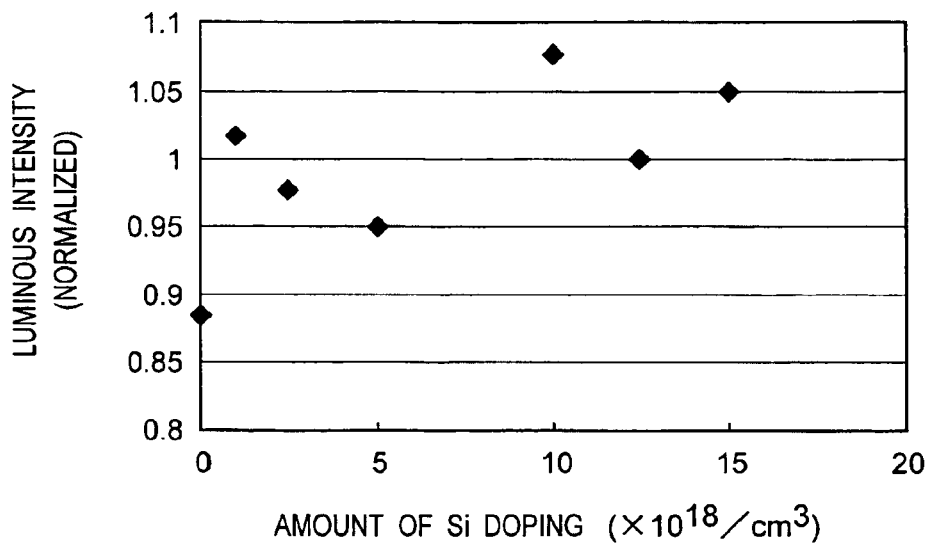
FIG. 10 is a graph for illustrating luminous intensity of the respective samples of Example 5.

The results are shown in FIGS. 9 and 10.

As illustrated in FIG. 9, it was confirmed that the luminous intensity and forward voltages were substantially independent from the amount of Si-doping for the Si-doped GaN layer 11b.

Example 6

In the Example 6, in respective samples with a contact layer being arranged in that the ratio between the film thickness of the Mg-doped GaN layers 11a (84 Å) and the Si-doped GaN layers 11b (36 Å) was 7:3, which also comprised one period, and in that 10 periods thereof were repeated, the amount of Si-doping for the Si-doped GaN layers 11b was respectively varied in the range of 0 to $1.5\times10^{19}/cm^3$, hole measurements were performed prior to and after thermal annealing.

It should be noted that the heat treatment was performed at 650° C. for 0.5 hour.

Figure 11:
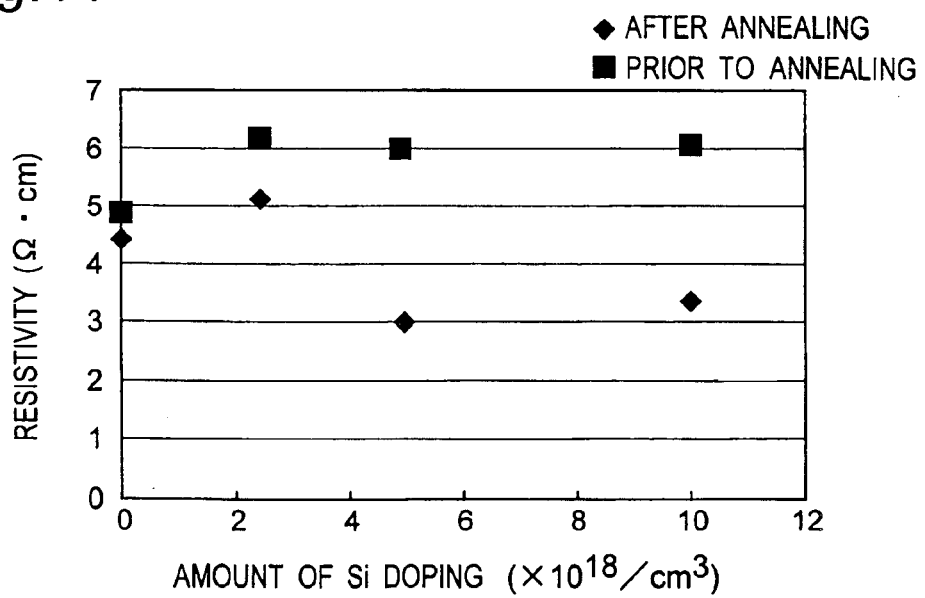
FIG. 11 is a graph illustrating resistivities prior to and after heat treatment of respective samples of Example 6 according to the present invention.

The results are shown in FIG. 11.

It was consequently confirmed that in samples with a relatively large amount of doping for the Si-doped GaN layers 11b of $5\times10^{18}/cm^3$ and $1\times10^{19}/cm^3$, the reduction in resistivity was remarkable through thermal annealing.

Such values of resistivity were lower than 10Ω·cm, which is a resistivity when the p-contact layer is comprised of a single layer of p-GaN, and it was confirmed that the contact layer of the present invention in which the Mg-doped GaN layers 11a and Si-doped GaN layers 11b were laminated in an alternate manner was also effective in achieving low resistivity.

Industrial Applicability

As explained so far, since the nitride semiconductor element according to the present invention is arranged in that pn junction is formed within the above p-type contact layer, the electrostatic breakdown voltage (ESD tolerance) when voltage is applied in a reverse direction can be made high and the leakage current may be made small.

With this arrangement, the present invention is applicable to purposes in which it is required for higher ESD tolerance.

What is claimed is:

1. A nitride semiconductor element comprising: an active layer of nitride semiconductor interposed between a p-side layer and an n-side layer, which respectively consist of a plurality of nitride semiconductor layers, said p-sided layer having a p-type contact layer as a layer for forming p-ohmic electrodes, wherein said p-type contact layer is formed by laminating p-type nitride semiconductor layers and n-type nitride semiconductor layers in an alternate manner, wherein the n-type nitride semiconductor layers are doped with Si and the p-type nitride semiconductor layers are doped with Mg.

2. The nitride semiconductor element according to claim 1;

wherein the thickness ratio of said p-type nitride semiconductor layers with respect to said n-type nitride semiconductor layers (the thickness of p-typed nitride semiconductor layers/the thickness of n-type nitride semiconductor layers) is set to be not less than 1 and not more than 9.

3. The nitride semiconductor element according to claim 1;

the thickness of said n-type nitride semiconductor layers is not more than 60 Å.

4. The nitride semiconductor element according to claim 2;

the thickness of said n-type nitride semiconductor layers is not more than 60 Å.

5. The nitride semiconductor element according to claim 1;

wherein the n-type nitride semiconductor layers consist of GaN doped with Si.

6. The nitride semiconductor element according to claim 1;

wherein the n-type nitride semiconductor layers consist of GaN doped with Si and the thickness of said n-type nitride semiconductor layers is not more than 60 Å.

7. The nitride semiconductor element according to claim 1;

wherein the p-type nitride semiconductor layers consist of GaN doped with Mg.

8. The nitride semiconductor element according to claim 1;

wherein the n-type nitride semiconductor layers consist of GaN doped with Si and the p-type nitride semiconductor layers consist of GaN doped with Mg.

9. The nitride semiconductor element according to claim 2;

wherein the n-type nitride semiconductor layers consist of GaN doped with Si.

10. The nitride semiconductor element according to claim 2;

wherein the p-type nitride semiconductor layers consist of GaN doped with Mg.

11. The nitride semiconductor element according to claim 2;

wherein the n-type nitride semiconductor layers consist of GaN doped with Si and the p-type nitride semiconductor layers consist of GaN doped with Mg.

12. The nitride semiconductor element according to claim 3;

wherein the n-type nitride semiconductor layers consist of GaN doped with Si.

13. The nitride semiconductor element according to claim 3;

wherein the p-type nitride semiconductor layers consist of GaN doped with Mg.

14. The nitride semiconductor element according to claim 3;

wherein the n-type nitride semiconductor layers consist of GaN doped with Si and the p-type nitride semiconductor layers consist of GaN doped with Mg.

15. The nitride semiconductor element according to claim 1;

wherein an amount of Si-doping in the p-sided contact layer is within a range of $1\times10^{17}/cm^3$ to $1\times10^{21}/cm^3$.

16. The nitride semiconductor element according to claim 3;

wherein a p-pad electrode is formed on the p-ohmic electrode.

17. The nitride semiconductor element according to claim 16;

wherein the thickness of said n-type nitride semiconductor layers is not more than 60 Å, wherein an amount of Si-doping in the p-sided contact layer is within a range of $1\times10^{17}/cm^3$ to $1\times10^{21}/cm^3$ and an amount of Mg-doping in the p-sided contact layer is within a range of $1\times10^{18}/cm^3$ to $1\times10^{21}/cm^3$.

* * * * *